United States Patent
Davlin et al.

(10) Patent No.: US 6,946,407 B2
(45) Date of Patent: *Sep. 20, 2005

(54) METHOD FOR PRETREATING A SUBSTRATE PRIOR TO APPLICATION OF A POLYMERIC COAT

(75) Inventors: John T. Davlin, Nampa, ID (US); Douglas S. Schramm, Boise, ID (US); Lorna M. Mitson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/770,801

(22) Filed: Feb. 3, 2004

(65) Prior Publication Data

US 2004/0157471 A1 Aug. 12, 2004

Related U.S. Application Data

(63) Continuation of application No. 10/184,493, filed on Jun. 28, 2002, now Pat. No. 6,784,120, which is a continuation of application No. 09/372,631, filed on Aug. 11, 1999, now Pat. No. 6,461,983.

(51) Int. Cl.[7] .................. H01L 21/31; H01L 21/469
(52) U.S. Cl. .................. 438/782; 438/780; 438/781; 427/240; 427/384; 427/385.5
(58) Field of Search .................. 438/780, 781, 438/782; 427/240, 384, 385.5

(56) References Cited

U.S. PATENT DOCUMENTS

| | | | | |
|---|---|---|---|---|
| 4,113,492 A | | 9/1978 | Sato et al. | |
| 4,826,754 A | * | 5/1989 | Bobbio | 430/311 |
| 5,066,616 A | * | 11/1991 | Gordon | 430/272.1 |
| 5,264,246 A | * | 11/1993 | Ikeno | 427/240 |
| 5,773,083 A | * | 6/1998 | Fischer et al. | 427/240 |
| 6,001,417 A | | 12/1999 | Nunotani et al. | |
| 6,048,914 A | | 4/2000 | Goto et al. | |
| 6,147,010 A | | 11/2000 | Whitman | |
| 6,284,676 B1 | | 9/2001 | Whitman | |
| 6,461,983 B1 | * | 10/2002 | Davlin et al. | 438/782 |
| 6,579,471 B2 | | 6/2003 | Whitman | |
| 6,784,120 B2 | * | 8/2004 | Davlin et al. | 438/782 |
| 2002/0168874 A1 | | 11/2002 | Davlin et al. | |

OTHER PUBLICATIONS

El-Kareh, "Fundamentals of Semiconductor Processing Technologies," Boston, MN, 1995: 211.

Wolf et al., "Silicon Processing for the VLSI Era vol. 1—Process Technology," Sunset Beach, CA, 1986: 518.

* cited by examiner

Primary Examiner—Alexander Ghyka
(74) Attorney, Agent, or Firm—Mueting, Raasch & Gebhardt, P.A.

(57) ABSTRACT

A method is provided for more efficient application of a polymeric coating (e.g., die coat) to a substrate (e.g., wafer) surface. One aspect of the method comprises applying an organic liquid (e.g., organic solvent) to the wafer and spinning it to coat the entire wafer surface prior to the application of die coat. This reduces surface tension on the wafer and reduces the amount of die coat required to achieve a high quality film.

33 Claims, 2 Drawing Sheets

METHOD FOR PRETREATING A SUBSTRATE PRIOR TO APPLICATION OF A POLYMERIC COAT

This is a continuation of application Ser. No. 10/184,493, filed Jun. 28, 2002 U.S. Pat. No. 6,784,120, which is a continuation of application Ser. No. 09/372,631, filed Aug. 11, 1999 (now U.S. Pat. No. 6,461,983), which are all incorporated herein by reference their entireties.

FIELD OF THE INVENTION

The present invention relates in general to processing substrates such as semiconductor wafers, and particularly to preparing a semiconductor wafer before the application of a die coat.

BACKGROUND

Both high density and lower density integrated circuits are fabricated on wafers utilizing numerous fabrication techniques, including, but not limited to, photolithography, masking, diffusion, ion implantation, etc. After the wafers are fabricated, with the wafer including a plurality of integrated circuit dies, a die coat is commonly used to protect the plurality of integrated circuit dies from damage during the remainder of the manufacturing process. It is commonly known to use polyimides as the buffer or die coat when fabricating such devices or wafers.

Polyimides utilized as a spin-on die coat are somewhat expensive. Typically, conventional processes for applying a die coat require about 5 grams of die coat polymer per wafer. When one considers the volume of wafers processed over, for example, one year, this is a significant amount of material and a significant part of the cost of processing. What is needed is a way to reduce the amount of die coat polymer used without significantly impacting process latitudes. One reason retaining process latitudes is important is because wafer-to-wafer repeatability is enhanced by wider process latitudes.

The goal of the coating step is to produce a generally uniform, adherent, defect-free polymeric film of desired thickness over the entire wafer. Spin coating is by far the most widely used technique to apply such films. This procedure is carried out by dispensing a liquid die coat polymeric composition onto the wafer surface, and then rapidly spinning the wafer until the die coat is distributed over the entire wafer surface.

The spin coating procedure begins with dispensing the polymeric composition onto the wafer. The dispensing stage could be accomplished by flooding the entire wafer with polymeric composition (requiring much more than 5 grams of material per wafer), or by dispensing a smaller volume of polymeric composition at the center of the wafer. The wafer is then brought to a constant spin speed to distribute the composition evenly over the wafer surface. During conventional processing, the wafers are typically subjected to an intermediate ramp spin speed followed by a final spin speed. Film thickness typically depends on the viscosity of the solvent-containing liquid polymeric composition and the final spin speed and time duration of the spin. Once the die coat polymeric composition is distributed, edge bead removal solution is added to the wafer and spun to remove excess die coat material from the wafer. Immediately following the application of the die coat material and the bead removal solution, the wafer is dried or "softbaked" by a heat source such as a hotplate.

SUMMARY

The present invention provides a method for treating a substrate, such as a semiconductor wafer, with at least one organic liquid (e.g., organic solvent) prior to depositing a polymeric coating, such as a die coat polymer thereon. Significantly, for preferred embodiments of the present invention, the use of a solvent prewet (as this pretreatment step is referred to herein) reduces the amount of polymer (e.g., die coat polymer) by more than about half compared to a process that does not use a solvent prewet. For example, this solvent prewet process achieves very good polymeric coating thickness profiles (e.g., both wafer to wafer and across wafer), with less than about 5 grams, and more preferably, with less than about 3 grams, and most preferably, with only about 1 gram to about 2 grams, of polymeric material per standard wafer. The method of the present invention preferably results in a very clean film, with good uniformity, with the use of significantly less polymer.

It has been shown that material costs can be reduced and wafer-to-wafer repeatability can be enhanced for a photoresist coating through the use of a solvent prewet. In this system, a solvent is initially spun onto a wafer followed by a photoresist composition. The photoresist composition, which retains essentially the same chemical composition throughout processing, differs from a die coat composition in that the die coat composition includes a "precursor" material that is converted to a polymeric coating. For example, in typical polyimide die coat systems, the precursor is a polyamic acid that is converted to a polyimide after a high temperature cure. Additionally, the photoresist composition has a very low viscosity relative to a die coat polymeric composition. Typically, the ratio of viscosities of a die coat polymeric coating composition to a typical photoresist coating composition is about 100:1. Furthermore, a photoresist material is removed, whereas a die coat material remains on the wafer. Thus, it is unexpected that a solvent prewet would not adversely affect the adhesion of a die coat material.

In a preferred embodiment of the present invention, at least one organic liquid (e.g., organic solvent) is dispensed on a first major surface of a substrate (e.g., wafer) and spun to cover the surface prior to dispensing and spinning a die coat composition on the substrate surface. Preferably, the solvent or solvent mixture is compatible with the polymeric (preferably, die coat) material employed in the over coating (e.g., die coat). As used herein, the term "compatible" means that the organic liquid (e.g., solvent) does not interfere with the performance properties of the polymeric material or conversion of a polymeric precursor to a polymeric material. Such properties include, for example, adhesion, film retention, etc. A preferred organic liquid for the prewet in the present invention is one that is used in the formulation of the polymeric (preferably, die coat) composition. The organic liquids typically used have a relatively low vapor pressure, e.g., less than about 100 mm Hg at 20° C., although higher vapor pressure liquids can be used. The use of a compatible organic liquid (and preferably, a low vapor pressure solvent) for pre-treating the surface in this manner helps to maintain generally equal adhesion properties with much less surface tension. The net result is a clean film coating with significant uniformity achieved using less polymeric material than conventional methods (without a solvent prewet step).

In one specifically preferred embodiment the present invention provides a method of coating a wafer including dispensing at least one organic solvent on a first major surface of the wafer; spinning the wafer until the solvent is distributed across the wafer surface; dispensing a die coat composition on the wafer having solvent on its surface; and spinning the wafer until the die coat composition is distributed across the wafer surface.

In another embodiment, a method is provided for coating a substrate that includes dispensing at least one organic liquid on a first major surface of the substrate; spinning the substrate until the organic liquid is distributed across the substrate surface; dispensing a polymeric precursor composition on the substrate having organic liquid on its surface; and spinning the substrate until the polymeric precursor composition is distributed across the substrate surface; wherein the polymeric precursor composition is converted to polymeric coating that is not subsequently removed from the substrate.

In yet another embodiment, a method is provided that involves incorporating an additional nozzle into a wafer processing machine; positioning the additional nozzle such that it is directed at the center of a wafer held in the wafer processing machine; causing the nozzle to dispense at least one organic solvent on the wafer by triggering a solenoid; spinning the wafer until the organic solvent is distributed across the wafer surface; dispensing a die coat composition on the wafer having organic solvent on its surface; and spinning the wafer until the die coat is distributed across the wafer surface.

In still another embodiment is a method that involves dispensing at least one prewet solvent on a first major surface of a wafer; spinning the wafer to distribute the prewet solvent across the wafer surface; dispensing a die coat composition comprising at least one die coat composition solvent on the first major surface of the wafer having at least one prewet solvent thereon; spinning the wafer to distribute the die coat composition across the wafer surface; and dispensing at least one edge bead removal solvent on a second major surface of the wafer and the edge of the wafer to remove die coat composition present on the second major surface and the edge of the wafer; wherein at least one prewet solvent is the same as at least one die coat composition solvent and at least one edge bead removal solvent.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE PREFERRED EMBODIMENTS

Figure 1:
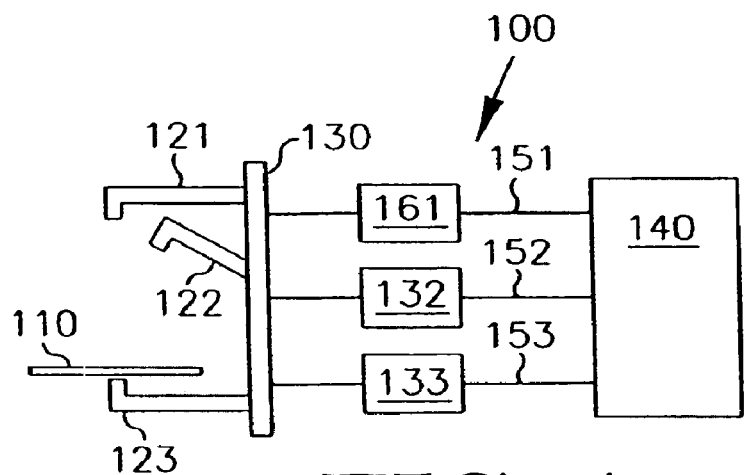
FIG. 1 is a block diagram of a conventional solvent dispensing apparatus.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention. It is to be understood that other embodiments may be utilized and that changes may be made without departing from the spirit and scope of the present invention. The following detailed description is, therefore, not to be taken in a limiting sense, and the scope of the present invention is defined by the appended claims.

It is to be understood that the term substrate, as used herein, includes a wide variety of semiconductor-based structures. A substrate can be a single layer of material, such as silicon (Si) wafer. Substrate is also to be understood as including silicon-on-sapphire (SOS) technology, silicon-on-insulator (SOI) technology, doped and undoped semiconductors, epitaxial layers of silicon (Si) supported by a base semiconductor, as well as other semiconductor-based structures, including any number of layers as is well known to one skilled in the art. Furthermore, when reference is made to a substrate in the following description, previous process steps may have been utilized to form regions/junctions in a base semiconductor structure.

Thus, in the following text the term "wafer" is intended as a representative reference to the substrate or base upon which an integrated circuit device is to be constructed. The term "die coat" is intended as a representative reference to a polymeric coating (e.g., over coating) that is not removed in subsequent processing. Preferably, the term represents any of the set of materials known and used in the art as die coats, for example, polyimides and polybenzoxazole. The term "organic solvent" is intended as a representative reference to an organic liquid that is typically used as a solvent, particularly in a die coat composition, although it is not necessarily being used for its solubilizing ability.

According to the present invention, a pretreatment or prewet step is performed prior to the die coat dispense step. This pretreatment step preferably includes dispensing organic solvent(s) onto the wafer, and then spinning the wafer partially dry in order to spread the solvent evenly over the wafer surface. Subsequently, the die coat composition is applied. This solvent pretreatment or prewet allows the die coat to flow and evenly distribute across the wafer surface with less die coat material.

The presence on the wafer surface of the solvent prior to dispensing die coat polymer reduces the surface tension. As a result of the reduced surface tension, when a die coat composition is subsequently dispensed, a clean coat is achieved using substantially less die coat material. That is, the die coat created following the pretreatment step of the present invention shows the same number or fewer surface defects than a coat created using conventional methods. As used herein, the term "clean" refers to a die coat possessing at least the same uniformity or better uniformity than a die coat prepared by a conventional process. The ability to obtain the same overall coat thickness as a conventional process assists to maintain the same or better adhesion and photo properties as the conventional process, and thus results in the same or better overall reliability of the wafer. Good film uniformity is also obtained using significantly less die coat polymer. Preferably, the method of the present invention provides a wafer to wafer die coat uniformity of typically less than about 10% across the wafer and typically less than about 5% from wafer to wafer. This ensures greater process control.

Including the prewet step reduces the amount of expensive die coat material used by at least about 50%, and often by up to about 60%. As an example, where a conventional system dispenses 5 grams of die coat polymer per wafer, a process employing the prewet step reduces the amount of die coat polymer used to 2 grams per wafer. The reduction in die coat dispensed also reduces the amount of solvent waste, providing additional economic and ecologic benefits. Those skilled in the art will recognize that these examples are offered for illustration only and are not intended to be exclusive or limiting.

For solvent prewet and die coating wafer processing using spin-on coating techniques, timing is important in obtaining wafer-to-wafer repeatability. Mechanical requirements are also less restrictive because the overall process time is less with the prewet process as compared to the conventional process. In a conventional process that does not involve a solvent prewet, there is an intermediate ramp speed followed by a final spin speed. With a solvent prewet, the subsequent die coating process can be ramped up faster without an intermediate spin speed, although an intermediate spin speed can be used if desired. This reduces mechanical wear of the equipment.

A typical die coat composition contains at least one organic solvent. Additionally, the die coat composition also typically contains a polymer precursor and other additives including, but not limited to, photoactive compounds, adhesion promoters, and stabilizers. In a preferred embodiment, the same solvent that is used in the die coat composition and/or to clean the wafer edges after the die coat has been deposited (e.g., an edge bead removal solvent) is used in the prewet step. This may potentially eliminate undesirable interactions that could change the performance of the polymer die coating material. Using the same solvent in as many steps as possible reduces the opportunity for unexpected reactions between the materials, and also simplifies the plumbing requirements of the coating apparatus.

Preferred organic solvents for the pretreatment (prewet) of a wafer prior to die coat application include those organic liquids having a vapor pressure of less than about 100 mm Hg at 20° C. Although these are preferred, higher vapor pressure solvents can be used as long as they are able to form a very thin layer of solvent (preferably, a monolayer of solvent molecules) onto which the subsequent die coat polymeric composition is spun.

A process using a low vapor pressure (i.e., low evaporation rate) solvent as a prewet, could spin the wafer for up to five seconds and still maintain a thin layer of the solvent on the wafer. In contrast, a process using a high vapor pressure (i.e., high evaporation rate) solvent as a prewet would not be able to spin for as long of a time and still maintain a thin layer of solvent on the wafer. This would result in the wafer being completely dry and consequently no different than conventional coating. The ability to extend the spin period for a low vapor pressure solvent may increase the repeatability across fabrication machines.

Examples of suitable solvents include, but are not limited to, methanol, N-methyl pyrrolidone (NMP), gamma-butyro lactone (GBL), N,N, dimethylformamide, N-butylacetate, methanol, and RER 470 (30% N-methyl-2-pyrrolidone (NMP) and 70% cyclopentanone) available from Olin Hunt Corporation. Those skilled in the art will recognize that other solvents may be used in the implementation of the present invention without exceeding it's scope and spirit.

The die coat composition typically includes at least one polymer precursor, such as polyamic acid, polyamic ester, or polybenzoxazole precursors. The die coat composition also contains at least one organic solvent, such as the solvents described above. In addition to the polymer precursor and organic solvent, additional additives may be employed in the die coat composition. These additives include, but are not limited to, stabilizers, adhesion promoters, photoactive compounds, surfactants, etc.

Typically, according to the present invention, the solvent is dispensed on a wafer and evenly distributed by spinning the wafer to form a very thin layer. This is typically carried out in less than about two seconds at ambient temperature and pressure. Prior to evaporation, a die coat composition is dispensed onto the solvent-coated wafer and evenly distributed by spinning the wafer. This is typically carried out in less than about 30 seconds. Spinning of the wafer typically continues for at least about 30 seconds, and preferably no greater than about 40 seconds to chemically remove the die coating from the edge and backside of the wafer according to conventional wafer manufacturing procedures known in the art. The final thickness of the wafer is principally controlled by the overall spin process, which is typically carried out at room temperature and pressure.

As is well known to one skilled in the art, when spinning on a coating material such as polyimide coating material, the coating material is applied on the wafer surface to be coated and the wafer is then spun such that the coating material is distributed over the wafer by centrifugal force. The final thickness of the layer of coating material on the wafer is based on, at least in part, the spin rate, the viscosity of the coating material, temperature, pressure, etc. The preferred thickness of the die coating material applied on the wafer is in the range of about 1 micron to about 24 microns. More preferably, the thickness of the die coating material is in the range of about 5 microns to about 15 microns.

The spinning process, for both the solvent prewet and the die coat, can be carried out in numerous steps. For example, the solvent prewet or the die coating material can be dispensed on the wafer while the wafer is standing still and then the speed is increased to a particular speed for distributing the material over a period of time. Any number of intermediate spinning steps could be utilized such as going from stand still to an intermediate speed for a particular period of time and then further increasing the spinning speed. It will be readily apparent that a multitude of spinning parameters are contemplated in accordance with the present invention as described in the accompanying claims. The spinning process can be carried out with any number of different spin coating systems.

The methods of the present invention can use conventional track coating units, as shown in FIG. 1, which employ a fixed dispense head 130 with a first dispense nozzle 121 for dispensing die coat directly onto the wafer 110. The timing and flow of die coat through nozzle 121 is controlled by pump 161. Pump 161 is in communication with track coating logic 140 by wire 151, and is triggered by binary coding contained in the recipe executed by logic 140. Second nozzle 122 dispenses solvent on the edge and sides of wafer 110 for edge bead removal after the die coat has been spun the requisite amount of time to obtain the desired thickness. Third nozzle 123 dispenses solvent on the backside of wafer 110 for cleaning after die coat deposition. The timing and flow of solvent through nozzles 122 and 123 is controlled by solenoids 132 and 133, respectively. Solenoids 132 and 133 are also in communication with track coating logic 140 via wires 152 and 153, and triggered by binary coding contained in the recipe executed by logic 140. For example, binary code of '1' triggers solenoid 132 and a binary code of '2' triggers solenoid 133. A binary code of '3' triggers solenoids 132 and 133 simultaneously.

Figure 2:
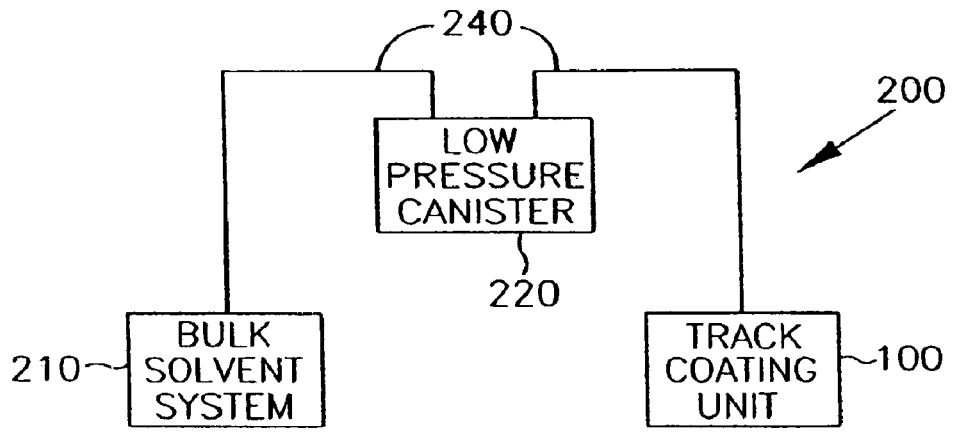
FIG. 2 is a block diagram of a semiconductor wafer processing system incorporating a bulk solvent system.

As shown in FIG. 2, solvent is held in a bulk solvent system 210 external to the track coating unit 100, and connected to the track coating unit 100 through a low pressure canister 220. The low pressure canister 220 maintains the proper fluid pressure and level for the track coating unit. The line carrying the solvent 240 connects to a dispense head 130 within track coating unit 100. Such systems are well-known in the art and so will not be described in further detail.

Figure 3:
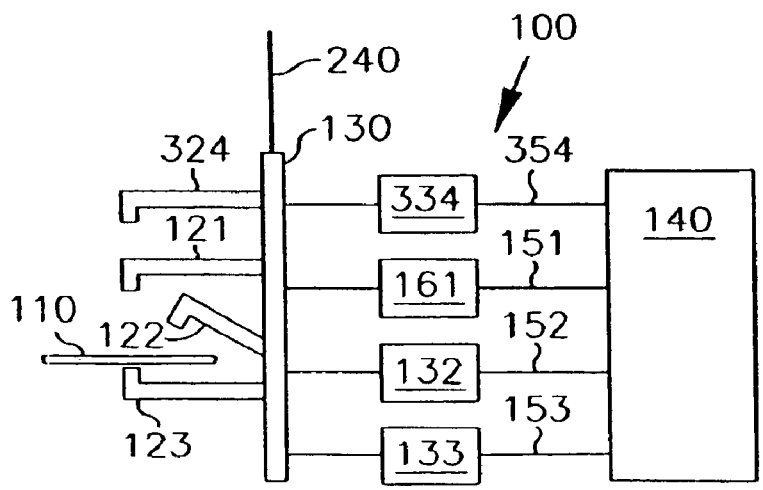
FIG. 3 is a block diagram of a solvent dispensing apparatus useful in the method of the present invention.

If desired, and as shown in FIG. 3, fourth nozzle 324 may optionally be positioned directly above wafer 110 to dispense solvent prior to die coat deposition. Nozzle 324 is controlled by solenoid 334 which is in communication with the track coating unit logic 140 via wire 354. Solenoid 334 is activated by binary coding executed in the coating unit logic 140.

One skilled in the art will recognize that the mechanical portions of this improvement (containing the fourth nozzle 324 and third solenoid 334) are easily integrated into conventional processing equipment. An additional binary code is also easily incorporated to trigger the fourth nozzle at the desired times. The net result is a simple-to-employ solvent dispense system which is both more reliable and more efficient than many conventional systems, and which greatly reduces wafer processing costs.

Figure 4:
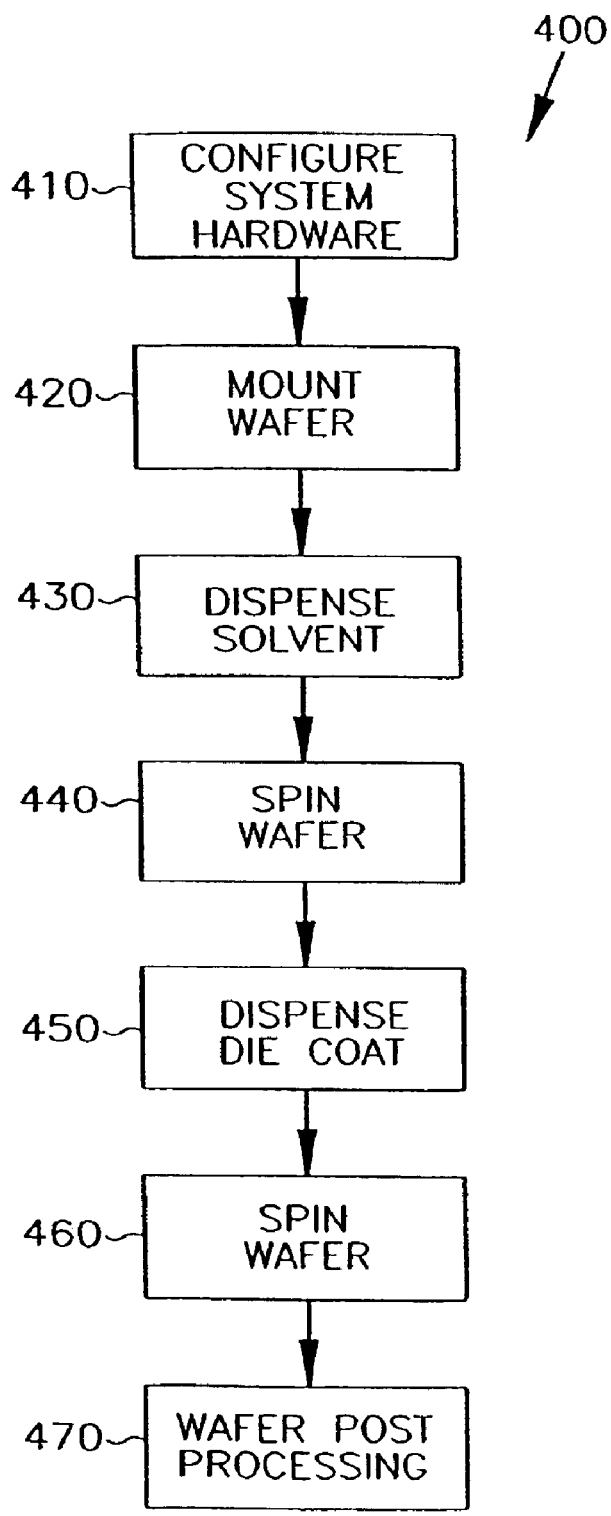
FIG. 4 is a flow diagram describing steps of a wafer coating method according to one embodiment of the present invention.

According to one embodiment of the present invention as outlined in the flow chart of FIG. 4, the initial step is to configure the coating system hardware (410). According to this embodiment of the present invention, this step includes incorporating a fourth nozzle into the system and positioning it such that it is directed at the center of a wafer held in the coating system. A wafer is then mounted in the coating system (420). Next, solvent is dispensed through the fourth nozzle onto the wafer (430). The wafer is then spun to partially dry the solvent and spread it over the surface of the wafer (440).

Once this wafer prewet process is complete, die coat is dispensed onto the wafer (450). The wafer is again brought to spin velocity to distribute the die coat over the wafer surface (460). The solvent coating the wafer reduces friction and allows the die coat to spread more quickly and at least as evenly as the conventional coat. Another effect is less die coat material needs to be dispensed to achieve adequate wafer coverage.

An organic solvent prewet (particularly one with low vapor pressure) ensures that a thin layer of solvent remains on the wafer throughout the die coat dispense and spin. The resulting decreased surface tension allows for the immediate ramp to the final spin speed without an intermediate step. As used herein, the "final spin speed" refers to the highest speed employed throughout the spin speed protocol. The final spin speed occurs during the thickness determining portion of the spin speed protocol and helps to reduce overall process time. Also, an organic solvent prewet (particularly, one with a low vapor pressure) may provide more time to spread the die coat over the wafer and more time to bring the wafer to the proper spin velocity and stabilize it. This enables greater wafer-to-wafer consistency throughout the batch. Once the die coat spin step is complete, post-processing is performed (470). Post-processing includes activities such as edge bead removal (EBR) and heating the die coat precursor to convert it to a die coat polymer. Those skilled in the art will recognize that the above description is offered for illustration and are not intended to be exclusive or limiting.

EXAMPLE

A typical solvent prewet and die coating process can be broken down into 15 steps as outlined below.

Step 1: Arm Positioning
Dispense arm moves to prewet position and wafer speed ramps up.

Step 2: Prewet Dispense
Dispense arm is at prewet position, wafer speed ramps up, and prewet chemical is dispensed on wafer.

Step 3: Prewet Spin Out
Arm moves to spin-on die coat dispense position, wafer speed ramps up, and prewet chemical is spun out to produce monolayer film.

Step 4: Chemical Dispense
Arm is at spin-on die coat dispense position, wafer speed ramps down, and spin-on die coat chemical is dispensed.

Step 5: Spin Out
Arm moves to home position, wafer speed ramps up, and spin-on die coat chemical is spun out to create a uniform coating.

Steps 6–8: Cast Time
Topside EBR Arm moves to position, wafer speed ramps down, spin-on die coat is spun to desired thickness, and some solvent is dried from spin-on die coat.

Steps 9–11: Topside and Backside EBR
EBR Arm moves to topside position, wafer speed ramps down, and spin-on die coat is chemically removed from the edge of the wafer (front and back).

Steps 12 and 13: EBR Dry Time
EBR Arm moves to home position, wafer speed ramps up, and spin-on die coat continues to be removed from the back edge of wafer.

Steps 14 and 15: Finish Process
Spindle moves to top (home) position, wafer speed ramps down.

Physical Results:

The desired percentage for Across the Wafer Uniformity is less that about 10%.

Across Wafer Uniformity for Standard Non-solvent Prewet Polyimide Process is 5707 angstroms (Å) or 5%, this is a 10 wafer average.

Across Wafer Uniformity for the Solvent Prewet Polyimide Process is 4371 Å.

The desired percentage for Wafer to Wafer Uniformity is less than about 5%.

Wafer to Wafer Uniformity for both the Standard Non-Solvent Prewet Polyimide Process and the Solvent Prewet Polyimide Process is less than about 1.5%.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of coating a substrate, comprising:

dispensing at least one organic liquid on a first major surface of the substrate;

spinning the substrate to distribute the organic liquid across the substrate surface;

dispensing a polymeric precursor composition on the substrate having organic liquid on its surface; and spinning the substrate to distribute the polymeric precursor composition across the substrate surface;

wherein the polymeric precursor composition is converted to polymeric coating that is not subsequently removed from the substrate.

2. A method of coating a wafer, comprising:
incorporating an additional nozzle into a wafer processing machine;
positioning the additional nozzle such that it is directed at the center of a wafer held in the wafer processing machine;
causing the nozzle to dispense at least one organic solvent on the wafer by triggering a solenoid;
spinning the wafer to distribute the organic solvent across the wafer surface;
dispensing a die coat composition on the wafer having organic solvent on its surface; and
spinning the wafer to distribute the die coat across the wafer surface.

3. The method of claim 2 wherein the solvent has a vapor pressure of less than about 100 mm Hg at 20° C.

4. A method of coating a wafer, comprising:
incorporating an additional nozzle into a wafer processing machine;
positioning the additional nozzle such that it is directed at the center of a wafer held in the wafer processing machine;
causing the nozzle to dispense at least one organic solvent on the wafer by triggering a solenoid;
spinning the wafer at least until the organic solvent is distributed across the wafer surface;
dispensing a die coat composition on the wafer having organic solvent on its surface wherein the die coat composition comprises at least one polymer precursor; and
spinning the wafer at least until the die coat is distributed across the wafer surface.

5. A method of coating a wafer, comprising:
dispensing at least one organic solvent on a first major surface of the wafer;
spinning the wafer at least until the solvent is distributed across the wafer surface;
dispensing a die coat composition on the wafer having solvent on its surface, wherein the die coat composition comprises at least one polymer precursor and at least one organic solvent; and
spinning the wafer at least until the die coat composition is distributed across the wafer surface.

6. The method of claim 5 wherein the wafer is a silicon wafer.

7. The method of claim 5 wherein the step of dispensing a solvent comprises dispensing a solvent having a vapor pressure of less than about 100 mm Hg at 20° C. on the wafer.

8. The method of claim 5 wherein the step of dispensing a solvent comprises:
positioning a nozzle to dispense the solvent in the middle of the wafer;
controlling the nozzle with a solenoid; and
causing the nozzle to dispense the solvent by signaling the solenoid.

9. The method of claim 5 wherein dispensing at least one organic solvent on the wafer comprises dispensing at least one solvent that is the same as the at least one solvent of the die coat composition.

10. The method of claim 9 wherein the polymeric die coat is used in an amount less than the amount used under the same conditions without a solvent prewet step.

11. The method of claim 5 further comprising heating the die coat composition to form a polymeric die coat.

12. The method of claim 5 further comprising removing die coat composition from the edge of the wafer.

13. The method of claim 5 further comprising removing die coat composition from a second major surface of the wafer.

14. A method of coating a substrate, comprising:
dispensing at least one organic liquid on a first major surface of the substrate;
spinning the substrate to distribute the organic liquid across the substrate surface;
dispensing a die coat composition on the substrate having organic liquid on its surface, wherein the die coat composition comprises at least one organic solvent; and
spinning the substrate to distribute the die coat composition across the substrate surface.

15. The method of claim 14 wherein the die coat composition further comprises an additive selected from the group consisting of photoactive compounds, adhesion promoters, stabilizers, surfactants, and combinations thereof.

16. The method of claim 14 wherein the die coat composition further comprises a polymer precursor selected from the group consisting of polyamic acid, polyamic ester, polybenzoxazole precursors, and combinations thereof.

17. The method of claim 16 wherein the polymer precursor is converted to polymeric coating that is not subsequently removed from the substrate.

18. A method of coating a substrate, comprising:
dispensing at least one organic liquid on a first major surface of the substrate;
spinning the substrate at least until the organic liquid is distributed across the substrate surface;
dispensing a die coat composition on the substrate having organic liquid on its surface, wherein the die coat composition comprises an additive selected from the group consisting of photoactive compounds, adhesion promoters, stabilizers, surfactants, and combinations thereof; and
spinning the substrate at least until the die coat composition is distributed across the substrate surface.

19. The method of claim 18 wherein the organic liquid comprises an organic solvent.

20. The method of claim 19 wherein the die coat composition further comprises at least one organic solvent.

21. The method of claim 18 wherein the die coat composition further comprises a polymer precursor selected from the group consisting of polyamic acid, polyamic ester, polybenzoxazole precursors, and combinations thereof.

22. The method of claim 21 wherein the polymer precursor is converted to polymeric coating that is not subsequently removed from the substrate.

23. A method of coating a wafer, comprising:
dispensing at least one organic liquid on a first major surface of the wafer;
spinning the wafer to distribute the organic liquid across the wafer surface;
dispensing a die coat composition on the wafer having solvent on its surface, wherein the die coat composition comprises at least one organic solvent; and
spinning the wafer to distribute the die coat composition across the wafer surface.

24. The method of claim 23 wherein the die coat composition further comprises an additive selected from the group consisting of photoactive compounds, adhesion promoters, stabilizers, surfactants, and combinations thereof.

25. The method of claim 23 wherein the die coat composition further comprises a polymer precursor selected from the group consisting of polyamic acid, polyamic ester, polybenzoxazole precursors, and combinations thereof.

26. The method of claim 25 wherein the polymer precursor is converted to polymeric coating that is not subsequently removed from the wafer surface.

27. A method of coating a wafer, comprising:
dispensing at least one organic liquid on a first major surface of the wafer;
spinning the wafer at least until the organic liquid is distributed across the wafer surface;
dispensing a die coat composition on the wafer having solvent on its surface, wherein the die coat composition comprises an additive selected from the group consisting of photoactive compounds, adhesion promoters, stabilizers, surfactants, and combinations thereof; and
spinning the wafer at least until the die coat composition is distributed across the wafer surface.

28. The method of claim 27 wherein the organic liquid comprises an organic solvent.

29. The method of claim 28 wherein the die coat composition further comprises at least one organic solvent.

30. The method of claim 27 wherein the die coat composition further comprises a polymer precursor selected from the group consisting of polyamic acid, polyamic ester, polybenzoxazole precursors, and combinations thereof.

31. The method of claim 30 wherein the polymer precursor is converted to polymeric coating that is not subsequently removed from the wafer surface.

32. A method of coating a wafer, comprising:
dispensing at least one organic solvent on a first major surface of the wafer;
spinning the wafer to distribute the solvent across the wafer surface;
dispensing a die coat composition on the wafer having solvent on its surface; and
spinning the wafer to distribute the die coat composition across the wafer surface.

33. A method of coating a wafer, comprising:
dispensing at least one organic solvent on a first major surface of the wafer;
spinning the wafer to distribute the solvent across the wafer surface;
dispensing a die coat composition on the wafer having solvent on its surface wherein the die coat composition comprises at least one polymer precursor; and
spinning the wafer to distribute the die coat composition across the wafer surface.

* * * * *